(12) United States Patent
Whetsel, Jr. et al.

(10) Patent No.: US 6,675,333 B1
(45) Date of Patent: Jan. 6, 2004

(54) INTEGRATED CIRCUIT WITH SERIAL I/O CONTROLLER

(75) Inventors: Lee Doyle Whetsel, Jr., Plano, TX (US); Benjamin H. Ashmore, Jr., Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/718,206

(22) Filed: Nov. 21, 2000

Related U.S. Application Data (62) Division of application No. 09/320,491, filed on May 26, 1999, now Pat. No. 6,158,035, which is a division of application No. 08/935,751, filed on Sep. 23, 1997, now Pat. No. 6,085,344, which is a division of application No. 08/415,121, filed on Mar. 29, 1995, now Pat. No. 5,687,179, which is a continuation of application No. 08/082,008, filed on Jun. 24, 1993, now abandoned, which is a continuation of application No. 07/863,517, filed on Mar. 31, 1992, now abandoned, which is a continuation of application No. 07/502,470, filed on Mar. 30, 1990, now abandoned.

(51) Int. Cl.$^7$ .......................................... G01R 31/3185
(52) U.S. Cl. ...................................................... 714/726
(58) Field of Search ............................... 714/726, 727, 714/729, 730, 731

(56) References Cited

U.S. PATENT DOCUMENTS

| | | | |
|---|---|---|---|
| 3,873,818 A | 3/1975 | Barnard | 253/153 AC |
| 3,976,940 A | 8/1976 | Chau et al. | 324/73 R |
| 4,023,142 A | 5/1977 | Woessner | 340/172.5 |
| 4,066,882 A | 1/1978 | Esposito | 235/302 |
| 4,146,835 A | 3/1979 | Chnapko et al. | 324/73 R |
| 4,264,807 A | 4/1981 | Moen et al. | 235/92 GD |
| RE31,056 E | 10/1982 | Chau et al. | 324/73 R |

(List continued on next page.)

FOREIGN PATENT DOCUMENTS

| | | | |
|---|---|---|---|
| EP | 0136174 | 4/1985 | ............. G06F/9/30 |
| EP | 0148403 | 7/1985 | .......... G01R/31/28 |
| EP | 0190494 | 8/1986 | .......... G01R/31/28 |
| EP | 0195164 | 9/1986 | .......... G01R/31/28 |
| EP | 0273821 | 7/1988 | .......... G01R/31/28 |
| EP | 0310152 | 4/1989 | .......... G01R/31/28 |
| JP | 57-209546 | 12/1982 | .......... G06F/11/20 |
| JP | 58-155599 | 9/1983 | |
| JP | 59-210382 | 11/1984 | .......... G01R/31/28 |
| JP | 60-252958 | 12/1985 | .......... G06F/11/22 |
| JP | 62-228177 | 10/1987 | .......... G01R/31/28 |
| JP | 63-973169 | 4/1988 | .......... G01R/31/28 |
| JP | 1-43773 | 2/1989 | .......... G01R/31/28 |
| JP | 64-79673 A | 3/1989 | .......... G01R/31/28 |
| JP | 1-110274 | 4/1989 | .......... G01R/31/28 |
| JP | 1-170873 | 7/1989 | .......... G01R/31/28 |
| JP | 2-16642 A | 1/1990 | .......... G06F/11/22 |
| WO | WO 88/04097 | 6/1988 | .......... G11C/15/00 |

OTHER PUBLICATIONS

Breuer et al., "A Test and Maintenance Controller for a Module Containing Testable Chips", 1988 International Test Conference, pp. 502–513.* van Riessen et al., "Design and Implementation of a Hierarchical Testable Architecture Using the Boundary Scan Standard", $1^{st}$. European Test Conference, Apr. 12–14, 1989, pp. 112–118.*

(List continued on next page.)

*Primary Examiner*—Stephen M. Baker
(74) *Attorney, Agent, or Firm*—Lawrence J. Bassuk; W. James Brady; Frederick J. Telecky, Jr.

(57) ABSTRACT

A serial scan path communication architecture includes a plurality of circuits (30), some of which may include a memory (36). A memory access controller (38) is included on circuits with a memory (36) such that serial data may be written to and written from the memories without having to repetitively cycle through multiple shift operations.

7 Claims, 3 Drawing Sheets

U.S. PATENT DOCUMENTS

| | | | |
|---|---|---|---|
| 4,357,703 A | * 11/1982 | Van Brunt | 324/537 |
| 4,366,478 A | 12/1982 | Masuda et al. | 340/825 |
| 4,390,969 A | 6/1983 | Hayes | 395/550 |
| 4,426,697 A | 1/1984 | Petersen et al. | 340/825.52 |
| 4,439,858 A | 3/1984 | Petersen | 371/20 |
| 4,488,259 A | * 12/1984 | Mercy | 714/726 |
| 4,493,077 A | 1/1985 | Agrawal et al. | 371/25 |
| 4,494,066 A | * 1/1985 | Goel et al. | 714/726 |
| 4,498,172 A | 2/1985 | Bhavsar | 371/25 |
| 4,503,536 A | 3/1985 | Panzer | 371/25 |
| 4,513,373 A | 4/1985 | Sheets | 364/200 |
| 4,513,418 A | 4/1985 | Bardell, Jr. et al. | 371/25 |
| 4,519,078 A | 5/1985 | Komonytshy | 371/25 |
| 4,553,090 A | 11/1985 | Hatano et al. | 324/73 AT |
| 4,575,674 A | 3/1986 | Bass et al. | 324/73 R |
| 4,587,609 A | 5/1986 | Boudreau et al. | 395/726 |
| 4,594,711 A | 6/1986 | Thatte | 371/25 |
| 4,597,042 A | 6/1986 | d'Angeac | 364/200 |
| 4,598,401 A | 7/1986 | Whelan | 371/25 |
| 4,602,210 A | 7/1986 | Fasang et al. | 324/73 |
| 4,621,363 A | 11/1986 | Blum | 371/25 |
| 4,627,018 A | 12/1986 | Trost et al. | 395/476 |
| 4,638,313 A | 1/1987 | Sherwood, Jr. et al. | 340/825.52 |
| 4,646,298 A | 2/1987 | Laws et al. | 371/16 |
| 4,672,307 A | 6/1987 | Breuer et al. | 324/73 R |
| 4,679,192 A | 7/1987 | Vanbrabant | 340/825.52 |
| 4,680,539 A | 7/1987 | Tsai | 324/73 |
| 4,680,733 A | 7/1987 | Duforestel et al. | 364/900 |
| 4,694,293 A | 9/1987 | Sugiyama et al. | 340/825.68 |
| 4,698,588 A | 10/1987 | Hwang et al. | 324/73 R |
| 4,701,916 A | 10/1987 | Naven et al. | 371/15 |
| 4,701,921 A | 10/1987 | Powell et al. | 371/25 |
| 4,710,931 A | 12/1987 | Bellay et al. | 371/25 |
| 4,710,933 A | 12/1987 | Powell et al. | 371/25 |
| 4,745,355 A | 5/1988 | Eichelberger et al. | 324/73 R |
| 4,764,926 A | 8/1988 | Knight et al. | 371/25 |
| 4,777,616 A | 10/1988 | Moore et al. | 364/900 |
| 4,783,785 A | 11/1988 | Hanta | 371/25 |
| 4,791,358 A | * 12/1988 | Sauerwald et al. | 324/73.1 |
| 4,799,004 A | 1/1989 | Mori | 324/73 R |
| 4,799,052 A | 1/1989 | Near et al. | 340/825.52 |
| 4,802,163 A | 1/1989 | Hirabayashi | 371/15 |
| 4,821,269 A | 4/1989 | Jackson et al. | 371/16 |
| 4,833,395 A | 5/1989 | Sasaki et al. | 324/73 R |
| 4,833,676 A | 5/1989 | Koo | 371/15 |
| 4,857,835 A | 8/1989 | Whetsel, Jr. | 324/73 |
| 4,862,072 A | * 8/1989 | Harris et al. | 324/73.1 |
| 4,866,508 A | 9/1989 | Eichelberger et al. | 357/74 |
| 4,870,345 A | 9/1989 | Tomioka et al. | 371/22.3 |
| 4,872,169 A | 10/1989 | Whetsel, Jr. | 371/22.3 |
| 4,875,003 A | 10/1989 | Burke | 324/73 R |
| 4,878,168 A | * 10/1989 | Johnson et al. | 714/27 |
| 4,879,717 A | * 11/1989 | Sauerwald et al. | 714/727 |
| 4,887,262 A | * 12/1989 | van Veldhuizen | 370/449 |
| 4,887,267 A | 12/1989 | Kanuma | 371/22.3 |
| 4,894,830 A | 1/1990 | Kawai | 371/22.3 |
| 4,899,273 A | 2/1990 | Omoda et al. | 364/200 |
| 4,903,266 A | * 2/1990 | Hack | 708/252 |
| 4,912,633 A | 3/1990 | Schweizer et al. | 364/200 |
| 4,912,709 A | 3/1990 | Teske et al. | 371/22.1 |
| 4,931,722 A | 6/1990 | Stoica | 371/22.5 |
| 4,935,868 A | 6/1990 | Dulac | 364/200 |
| 4,937,826 A | 6/1990 | Gheewala et al. | 371/22.1 |
| 4,943,966 A | * 7/1990 | Giunta et al. | 714/5 |
| 4,945,536 A | * 7/1990 | Hancu | 714/724 |
| 4,956,602 A | 9/1990 | Parrish | 324/158 R |
| 4,974,192 A | 11/1990 | Face et al. | 364/900 |
| 4,974,226 A | * 11/1990 | Fujimori et al. | 714/726 |
| 4,989,209 A | 1/1991 | Littlebury et al. | 371/22.1 |
| 5,001,713 A | 3/1991 | Whetsel | 371/22.3 |
| 5,014,186 A | 5/1991 | Chisholm | 395/850 |
| 5,056,093 A | 10/1991 | Whetsel | 371/22.3 |
| 5,056,094 A | 10/1991 | Whetsel | 371/25.1 |
| 5,084,814 A | * 1/1992 | Vaglica et al. | 710/305 |
| 5,107,489 A | 4/1992 | Brown et al. | 370/58.2 |
| 5,115,435 A | 5/1992 | Langford, II et al. | 371/22.1 |
| 5,128,664 A | 7/1992 | Bishop | 340/825.52 |
| 5,133,062 A | 7/1992 | Joshi et al. | 395/500 |
| 5,159,465 A | 10/1992 | Maemura et al. | 326/73 |
| 5,165,022 A | 11/1992 | Erhard et al. | 395/275 |
| 5,167,020 A | * 11/1992 | Kahn et al. | 711/119 |
| 5,187,795 A | 2/1993 | Balmforth et al. | 395/800 |
| 5,214,760 A | 5/1993 | Hammond et al. | 395/250 |
| 5,218,702 A | 6/1993 | Kirtland | 395/298 |
| 5,276,807 A | 1/1994 | Kodama et al. | 395/309 |
| 5,329,471 A | 7/1994 | Swoboda et al. | 364/578 |
| 5,430,735 A | * 7/1995 | Sauerwald et al. | 714/731 |
| 5,495,487 A | 2/1996 | Whetsel, Jr. | 371/25.1 |
| 5,632,029 A | 5/1997 | Bruce et al. | 395/500 |
| 5,687,179 A | * 11/1997 | Whetsel, Jr. et al. | 714/726 |
| 5,802,270 A | 9/1998 | Ko et al. | 395/183.03 |
| 5,805,792 A | 9/1998 | Swoboda et al. | 395/183.04 |
| 5,905,738 A | 5/1999 | Whetsel | 371/22.4 |
| 6,085,344 A | * 7/2000 | Whetsel, Jr. et al. | 714/718 |

OTHER PUBLICATIONS

Zorian et al., "Designing Fault–Tolerant, Testable, VLSI Processors Using the IEEE P1149.1 Boundary–Scan Architecture", ICCD '89, Oct. 2–4, 1989, pp. 580–584.*

IBM Technical Disclosure Bulletin, "Test Bus Architecture", vol. 32, No. 3A, Aug. 1989, pp. 21–27.*

Avra, LaNae, "A VHSIC ETM–BUS Compatible Test and Maintenance Interface", 1987 International Test Conference, Paper 41.2, pp. 964–971.

Bhavsar, et al., "Self–Testing by Polynomial Division", Digest of Papers, International Test Conference, 1981, pp. 208–216.

Blair, Jack D.; Correale, Anthony, Jr.; Cranford, H. Clay; Dombrowski, Dave A.; Erdelyi, Charles K.; Hoffman, Charles R.; Lampere, Jeff L.; Lang, Kirk W.; Lee, Joseph, K.; Mullen, J. Mark; Norman, Vernon R.; Oakland, Steve F., "A 16–Mbit/s Adapter Chip for the IBM Token–Ring Local Area Network", IEEE Journal of Solid–State Circuits, vol. 24, No. 6, Dec. 1989, pp. 1647–1654.

Dervisoglu, Bulent I., "Using Scan Technology for Debug and Diagnostics in a Workstation Environment", 1988 International Test Conference, Paper 45.2, pp. 976–986.

El–ziq, et al., "A Mixed–Mode Built–In Self–Test Technique Using Scan Path and Signature Analysis", International Test Conference, Oct. 18–20, 1983, pp. 269–274.

Haedtke, et al., "Multilevel Self–test for the Factory and Field", Proceedings, Annual Relaibility and Maintanability Symposium, 1987.

Hahn, et al., "VLSI Testing By On–Chip Error Detection", IBM Technical Disclosure Bulletin, vol. 25, No. 2, Jul. 1982.

Hudson, et al., "Integrating BIST And Boundary–Scan On A Board", Proceedings of the National Communications Forum, Sep. 30, 1988, pp. 1796–1800.

Hudson, et al., "Parallel Self–test With Pseudo–Random Test Patterns", International Test Conference, Sep. 1–3, 1987, pp. 954–963.

IBM, "Bidirectional Double Latch", IBM Technical Disclosure Bulletin, vol. 28, No. 1, Jun., 1985.

Laurent, "An Example of Test Strategy for Computer Implemented with VLSI Circuits", IEEE International Conference on computer Design: VLSI in Computers, Oct. 7–10, 1985, pp. 679–682.

Lien, Jung–Cheun; Breuer, Melvin A., "A Universal Test and Maintenance Controller for Modules and Boards", IEEE Transactions on Industrial Electronics, vol. 36, No. 2, May 1989, pp. 231–240.

Maierhofer, J., "Heirarchial Self–Test Concept Based on the JTAG Standard", IEEE International Test Conference 1990, Paper 5.2, pp. 127–134.

Marlett, et al., "RISP Methodology", Electronic Engineering, Feb., 1989, pp. 45–48.

Maunder, Colin, and Beenker, Frans, "Boundary–Scan: A Framework for Structured Design–for–Test," paper 30.1, International Test Conference 1987 Proceedings.

Ohletz, et al., "Overhead in Scan and Self–testing Designs", International Test Conference, 1987, pp. 460–470.

Ohsawa, et al., "A 60–ns $–Mbit CMOS DRAM with Built–In self–Test Function", IEEE Journal of Solid–State Circuits, vol. SC–22, No. 5, Oct. 1987, pp. 663–668.

Paraskeva, et al., "New Test Structure for VLSI Self–Test: The Structured Test Register", 8030 Electronic Letters, 21 (1985) Sep. No. 19, Stenenage, Herts, Great Britain, Jul. 26, 1985.

Parker, "The Impact of Boundary Scan of Board Test", IEEE design & Test of Computers, Aug., 1989, pp. 18–30.

Pradhan, M.M., O'Brien, E.J., Lam, S.L., "Circular BIST with Partial Scan," 1988 International Test Conference, Paper 35.1, pp. 719–727.

Russell, "The JTAG Proposal and Its Impact On Automatic Test", ATE & Instrumentation Conference, Sep. 1988, pp. 289–297.

Sabo, et al., "Genesil Silicon Compilation and Design For Testability", IEEE Custom Integrated Circuits Conference, May 12–15, 1986, pp. 416–420.

Wagner, "Interconnect Testing With Boundary Scan", International Test Conference Proceedings, 1987, pp. 52–57.

Wang, et al., "Concurrent Built–In Logic Block Observer (CBILBO)", IEEE International Symposium On Circuits and Systems, May, 1986, vol. 3, pp. 1054–1057.

Wang, Laung–Terng; Marhoefer, Michael; McCluskey, Edward, J., "A Self–Test and Self–Diagnosis Architecture for Boards Using Boundary Scan", Proceedings $1^{st}$ European Test Conference, Paris, Apr. 12–14, 1989, pp. 119–126.

Whetsel, "A Proposed Standard Test Bus and Boundary Scan Architecture", IEEE International Conference on Computer Design: VLSI in Computers & Processes, Oct. 3–5, 1988, pp. 330–333.

Whetsel, "A View of the JTAG Port and Architecture", ATE & Instrumentation Conference West, Jan., 1988, pp. 385–401.

Whetsel, Lee, "A Standard Test Bus and Boundary Scan Architecture," pp. 48–59, Texas Instruments Technical Journal, Jul.–Aug. 1988, vol. 5, No. 4.

Whetsel, Lee, "JTAG Compatible Devices Simplify Board Level Design For Testability," 8080 Wescon Conference Record 33 (1989) Nov., pp. 294–299.

* cited by examiner

INTEGRATED CIRCUIT WITH SERIAL I/O CONTROLLER

This application is a divisional of application Ser. No. 09/320,491, filed May 26, 1999, now U.S. Pat. No. 6,158,035; which was a divisional of application Ser. No. 08/935,751, filed Sep. 23, 1997, now U.S. Pat. No. 6,085,344; which was a divisional of application Ser. No. 08/415,121, filed Mar. 29, 1995, now U.S. Pat. No. 5,687,179; which was a continuation of application Ser. No. 08/082,008, filed Jun. 24, 1993, now abandoned; which was a continuation of application Ser. No. 07/863,517, filed Mar. 31, 1992, now abandoned; which was a continuation of application Ser. No. 07/502,470, filed Mar. 30, 1990, now abandoned. Applicant claims priority from these applications.

TECHNICAL FIELD OF THE INVENTION

This invention relates in general to integrated circuits, and more particularly to serial data communication interfaces and architectures.

BACKGROUND OF THE INVENTION

Advance circuit design techniques have resulted in increasingly complex circuits, both at the integrated circuit and printed circuit board level of electronic design. Diminished physical access is an unfortunate consequence of denser designs and shrinking interconnect pitch. Testability is needed, so that the finished product is still both controllable and observable during test and debug. Any manufacturing defect is preferably detectable during final test before product is shipped. This basic necessity is difficult to achieve for complex designs without taking testability into account in the logic design phase, so that automatic test equipment can test the product. Exemplary test architectures are disclosed in U.S. patent application Ser. Nos. 07/391,751 and 07/391,801, to Whetsel, both filed Aug. 9, 1989, and the entire issue of the *Texas Instruments Technical Journal*, Vol. 5, No. 4, all of which are incorporated by reference herein.

Some existing test bus interfaces allow serial data to be shifted in and out of integrated circuits to facilitate testing of the logic in the device. These buses are designed primarily to transfer a single pattern of serial data into a selected scan path of the integrated circuit once per shift operation. However, in some applications, it may be required to utilize a serial test bus to load or unload a local memory in the integrated circuit. Since memories contain multiple data storage locations, multiple data patterns must be input using multiple shift operations. As a result, transferring data patterns into or out of memory is extremely time consuming due to the multiple shift operations.

Therefore, a need has arisen in the industry for a serial data input and output method which allows devices to be accessed in a more efficient manner than previously achieved.

SUMMARY OF THE INVENTION

In accordance with the present invention, a data communication interface is provided which substantially eliminates or prevents the disadvantages and problems associated with prior interface devices.

In the present invention, a data communication interface is provided for communication with a device. The data communication device includes bus circuitry for transferring data, storage circuitry coupled to the device and to the bus circuitry, and test interface circuitry operable to shift data between the bus and the device. Device access control circuitry is operable to transfer data between the device and the storage circuitry responsive to a control signal.

The present invention provides the technical advantage of allowing efficient communication with a device. The invention is compatible with existing interface structures and requires only minimal additional hardware.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–8 of the drawings, like numerals being used for like and corresponding parts of the various drawings.

Figure 1:
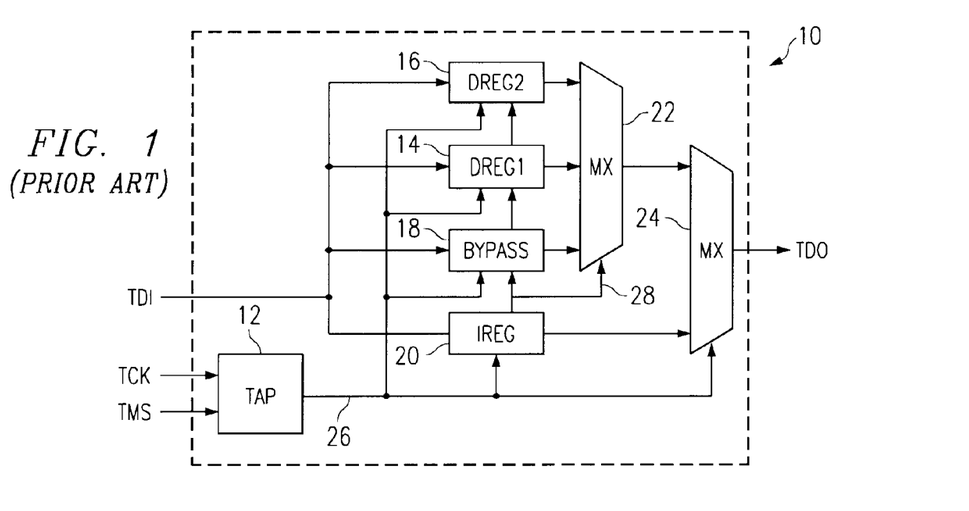
FIG. 1 illustrates a block diagram of a prior art test bus.

FIG. 1 illustrates a block diagram of prior art test bus and architecture 10. The architecture 10 includes TDI (test data input), TCK (test clock), and TMS (test mode select) inputs and a TDO (test data output) output. The TCK and TMS inputs are connected to a TAP (test access port) 12. The output of the TAP 12 is connected to data registers DREG1 14 and DREG2 16, bypass register 18 and instruction register IREG 20. The outputs of DREG1 14, DREG2 16 and bypass register 18 are connected to a first multiplexer 22. The output of the first multiplexer 22 and an output of the IREG 20 is connected to a second multiplexer 24. REG 20 is also connected to bypass register 18 and to the select port of the first multiplexer 22. The output of the TAP 12 is connected to IREG 20 and to the select port of the second multiplexer 24. The TDI input is connected to DREG1 14, DREG2 16, bypass register 18 and IREG 20. The output of the second multiplexer 24 is connected to the TDO output. The connection between the TAP 26 and DREGs 14 and 16, bypass register 18, IREG 20 and multiplexer 24 comprises a first control bus 28. The connections between IREG 20, bypass register 28 and first multiplexer 22 comprises a second control bus 28.

The architecture 10 shown in FIG. 1 corresponds to the IEEE P1149.1 test bus. While many types of test buses exist, the IEEE P1149.1 test bus will be used in this disclosure to describe the advantages of the invention. This architecture has been developed to provide a standard method to serially access serial shift registers in IC designs to facilitate testing. This test architecture, shown in FIG. 1, comprises an instruction register (IREG) 20, a set of data registers 14 referred to as bypass 18, DREG1 14 and DREG2 16, and a test interface referred to as a Test Access Port (TAP) 12. While only one IREG 20 may be implemented in the architecture, any number of DREGs can be included. Also, to conform to the P1149.1 standard, one of the DREGs must be dedicated to serve as a single bit bypass DREG. This bypass DREG allows abbreviating the data register scan path length through an IC to only one bit.

The IREG 20 and DREGs 14–18 exist on separate scan paths arranged in parallel between the test data input pin (TDI) and test data output pin (TDO). During IREG scan operations, the TAP 12 receives external control via the test mode select (TMS) and test clock (TCK) signals and outputs internal control via the control bus 26 to shift data through the IREG 20 from the TDI input to the TDO output. Similarly, DREG scan operations are accomplished by the TAP 12 receiving external control on the TMS and TCK input and outputting internal control on control bus 26 to shift data through the selected DREGs. Control for selecting one of the DREGs comes from the instruction shifted into the IREG and is output from the IREG via control bus 28. The control output on bus 28 is input to all DREGs and selects one for shifting. Control bus 28 is also input to multiplexer 22 to couple the serial output of the selected DREG to the TDO output.

The TAP 12 is a finite state machine which responds to a scan access protocol input via the TMS and TCK inputs. The purpose of the TAP 12 is to respond to the input scan access protocol to shift data through either the IREG 20 or a DREG 14–18. The TAP is clocked by the TCK input and makes state transitions based on the TMS input.

Figure 2:
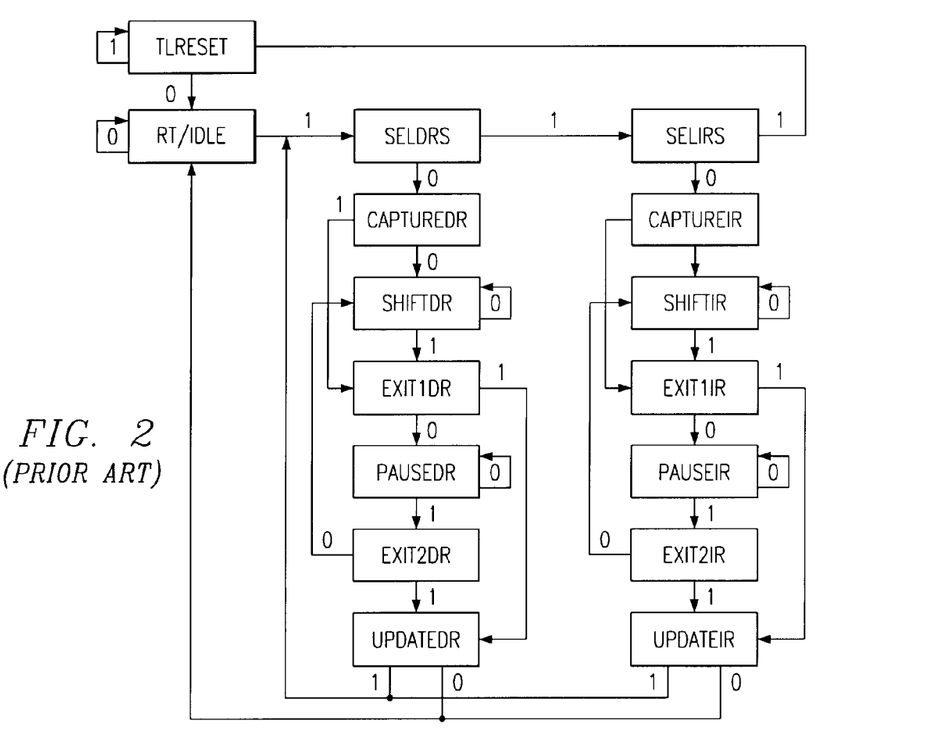
FIG. 2 illustrates a Test Access Port (TAP) state diagram.

The TAP state diagram is shown in FIG. 2 and comprises sixteen states: test logic reset (TLRESET), run test/idle (RT/IDLE), select data register scan (SELDRS), select instruction register scan (SELIRS), capture data register (CAPTUREDR), shift data register (SHIFTDR), exit1 data register (EXIT1DR), pause data register scan (PAUSEDR), exit2 data register (EXIT2DR), update data register (UPDATEDR), capture instruction register (CAPTUREIR), shift instruction register (SHIFTIR), exit1 instruction register (EXIT1IR), pause instruction register scan (PAUSEIR), exit2 instruction register (EXIT2IR), and update instruction register (UPDATEIR).

At power-up or during normal operation of the host IC, the TAP will be in the TLRESET state. In this state, the TAP issues a reset signal that places all test logic in a condition that will not impede normal operation of host the IC. When test access is required, a protocol is applied via the TMS and TCK inputs, causing the TAP to exit the TLRESET state and enter the RT/IDLE state. In FIG. 2, the TMS input that causes movements between the TAP states is indicated by a logic 0 or 1. TCK is the clock that causes the TAP state controller to transition from state-to-state.

From the RT/IDLE state, an instruction register scan protocol can be issued to transition the TAP through the SELDRS and SELIRS states to enter the CAPTUREIR state. The CAPTUREIR state is used to preload the IREG with status data to be shifted out of the TDO output pin. From the CAPTUREIR state, the TAP transitions to either the SHIFTIR or EXIT1IR state. Normally, the SHIFTIR will follow the CAPTUREIR state so that the preloaded data can be shifted out of the IREG for inspection via the TDO output while new data is shifted out of the IREG via the TDI input.

Following the SHIFTIR state, the TAP either returns to the RT/IDLE state via the EXIT1IR and UPDATEIR states or enters the PAUSEIR state via EXIT1IR. The reason for entering the PAUSEIR state would be to temporarily suspend the shifting of data through the IREG. From the PAUSEIR state, shifting can be resumed by re-entering the SHIFTIR state via the EXIT2IR state or it can be terminated by entering the RT/IDLE state via the EXIT2IR and UPDATEIR states.

From the RT/IDLE state, a data register scan protocol can be issued to transition the TAP through the SELDRS state to enter the CAPTUREDR state. The CAPTUREDR state is used to preload the selected DREG with data to be shifted out of the TDO output pin. From the CAPTUREDR state, the TAP transitions to either the SHIFTDR or EXIT1DR state. Normally the SHIFTDR will follow the CAPTUREDR state so that the preloaded data can be shifted out of the DREG for inspection via the TDO output while new data is shifted into the DREG via the TDI input. Following the SHIFTDR state, the TAP either returns to the RT/IDLE state via the EXIT1IR and UPDATEIR states or enters the PAUSEIR state via EXIT1IR. The reason for entering the PAUSEIR state would be to temporarily suspend the shifting of data through the IREG. From the PAUSEIR state, shifting can be resumed by re-entering the SHIFTIR state via the EXIT2IR state or it can be terminated by entering the RT/IDLE state via the EXIT2IR and UPDATEIR states.

From the RT/IDLE state, a data register scan protocol can be issued to transition the TAP through the SELDRS state to enter the CAPTUREDR state. The CAPTUREDR state is used to preload the selected DREG with data to be shifted out of the TDO output pin. From the CAPTUREDR state, the TAP transitions to either the SHIFTDR or EXIT1DR state. Normally, the SHIFTDR will follow the CAPTUREDR state so that the preloaded data can be shifted out of the DREG for inspection via the TDO output while new data is shifted out of the DREG for inspection via the TDO output while new data is shifted into the DREG via the TDI input. Following the SHIFTDR state, the TAP either returns to the RT/IDtE state via the EXIT1DR and UPDATEDR states or enters the PAUSEDR state via EXIT1DR. The reason for entering the PAUSEDR state would be to temporarily suspend the shifting of data through the DREG. From the PAUSEDR state, shifting can be resumed by re-entering the SHIFTDR state via the EXIT2DR state or it can be terminated by entering the RT/IDLE state via the EXIT2DR and UPDATEDR states.

Figure 3:
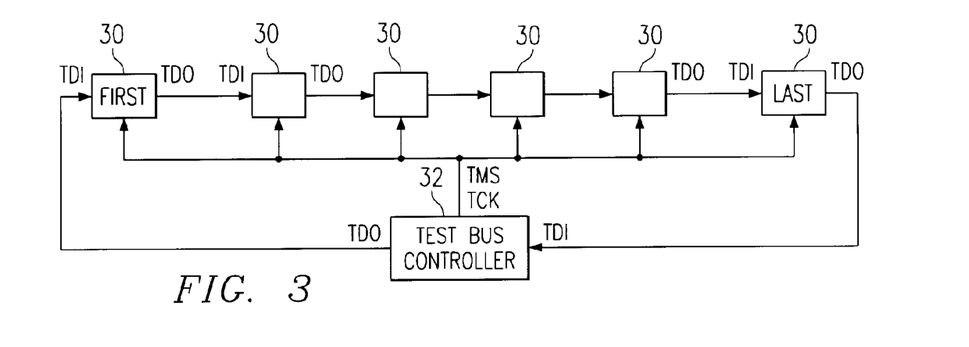
FIG. 3 illustrates a shift path through multiple integrated circuits.

In an application, any number of ICs that implement the P1149.1 architecture can be serially connected together at the circuit board level, as shown in FIG. 3. Similarly, any number of circuit boards can be connected together to further increase the number of ICs serially connected together. The ICs 30 in FIG. 3 are connected serially via their TDI input and TDO output pins from the first to the last IC. Also, each IC receives TMS and TCK control inputs from a test bus controller 32. The test bus controller also outputs serial data to the TDI input of the first IC in the serial path and receives serial data from the TDO of the last IC in the serial path. The test bus controller can issue control on the TMS and TCK signals to cause all the ICs to operate together to shift data through either their internal IREG or DREGs, according to TAP protocol previously described.

During IREG shift operations, the total length of the shift path is equal to the sum of the bits in each ICs IREG. For example, if one hundred ICs are in the serial path of FIG. 3 and each IC's IREG is eight bits long, the number of bits that must be shifted per IREG shift operation is eight hundred. Similarly, during DREG shift operations, the total length of the serial path is equal to the sum of the bits in each IC's selected DREG. If the bypass DREG is selected in each IC, the total number of bits shifted during a DREG scan is equal to the number of ICs times one bit, since the bypass DREG is only one bit long. Each IC can select a different DREG by loading in different instructions into the IREG. For instance, the first IC could be selecting a DREG with many bits while all other select their bypass DREG. Typically, when no testing is being performed in an IC, its bypass DREG is selected to reduce the IC's DREG bit length to a single bit.

Figure 4:
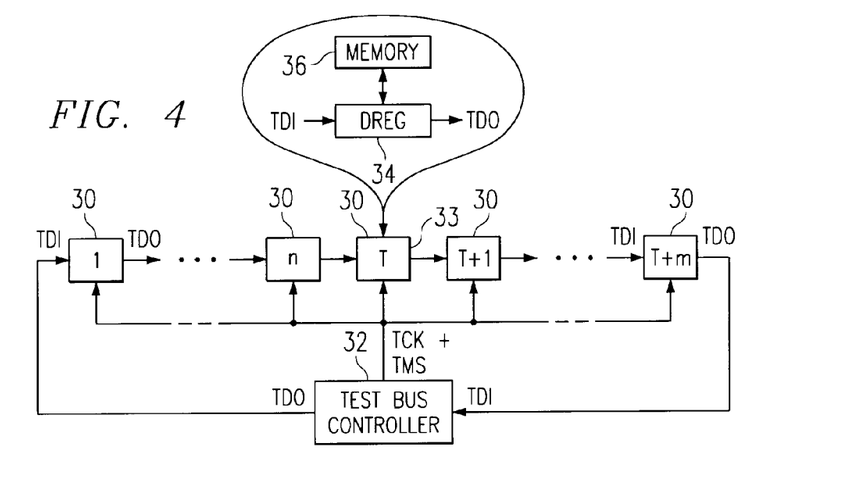
FIG. 4 illustrates an integrated circuit structure with a more detail block diagram of a target integrated circuit therein.

FIG. 4 shows an arrangement of ICs connected on the P1149.1 test bus similar to that of FIG. 3. The middle IC, referred to as the target 33, in the group contains a DREG 34 that is coupled to a device, shown as memory 36, to allow loading and/or unloading data to or from via the test bus. A view of the DREG and memory inside the target IC 33 is shown in FIG. 4. While the device associated with DREG 34 is shown as a memory, a data source or destination, such as an interface with another IC or board, could be coupled to the DREG 34. There are "n" ICs between the target IC's TDI input and the test bus controller's TDO output. Also, there are "ml" ICs between the target ICs TDO and the test bus controller's TDI input.

During memory read operations, the test bus controller 32 inputs control on the TMS and TCK inputs of the ICs in FIG. 4 to load instructions into each IC's IREG. To reduce the scan path length to a minimum length, all the ICs except for the target IC are loaded with an instruction which selects their bypass DREG. The target IC is loaded with an instruction that selects the DREG connected to the internal memory and configures the DREG and memory for a read operation.

When reading data from the memory 36 of the target IC, the test bus controller 32 only needs to input data from its TDI input; it does not necessarily need to output data from its TDO output. The bit length of the serial data input to the test bus controller is determined by the number of bits in the memory word plus a bit for each IC's (T+1 ... T+m) bypass register. Assuming the memory word width is eight bits and one hundred ICs exist between the target IC 33 and the test bus controller 32, the number of bits that must be input to the test bus controller 32 for each read operation is 108 bits.

During memory read operations, the TAP of each IC responds to the external TMS and TCK control signals from the test bus controller 32 to output internal control of bus 26 (see FIG. 1) to cause their DREGs to preload the data. The target IC's DREG preloads with the eight bit memory data word and the bypass registers of the other ICs T+1 through T+m) each preload with a logic zero. After the DREGs of each IC are loaded the test bus controller issues control on TMS and TCK to cause the TAPs in each IC to output internal control on bus 26 to shift out the data loaded in each IC's DREG.

The serial data input to the test bus controller's TDI input is a stream of 108 bits. The first one hundred bits are all logic zeros from the bypass registers of ICs T+1 through T+m, and the last eight bits are the data read from the memory of the target IC. After the test bus controller has received all 108 bits, it terminates the shifting operation by issuing control on the TMS and TCK signals to cause each TAP in each IC to halt the shifting process. This described process of preloading data, shifting out from the target IC, followed by halting the shift operation must be repeated for each additional data pattern read from the memory.

Table 1 shows the states (previously discussed in connection with FIG. 2) that the TAP of each IC in FIG. 4 must transition through to read one memory word. In Table 1, it is seen that it takes three TCKs at the start of each read operation before the shifting of data begins. One of the three TCKs is used to load data into the DREGs, the bypass registers of ICs T+1 through m are loaded with a logic zero and the DREG of the target IC is loaded with the eight bit memory word. The shifting of the data out of the ICs and into the test bus controller requires 108 additional TCKs. After the 108 bit data pattern is shifted out it takes two additional TCKS to terminate the memory read operation. The total number of TCKs required to read one 8-bit memory word from the target IC in FIG. 4 is 113. Thus, if the memory has 1,000 words to be read, the state sequences in Table 1 must be repeated 1,000 times for a total of 113,000 TCK cycles.

TABLE 1

| Present TAP State | Next TAP State | Action Performed | TCK Periods Per Read |
|---|---|---|---|
| RT/IDLE | SELDRS | NOP | 1 |
| SELDRS | CAPTUREDR | NOP | 1 |
| CAPTUREDR | SHIFTDR | Load Data Into DREGS | 1 |
| SHIFTDR | SHIFTDR | Shift Out Bypass Bit 1 | 1 |
| SHIFTDR | SHIFTDR | Shift Out Bypass Bit 2 | 1 |
| ↓ | ↓ | ↓ | ↓ |
| SHIFTDR | SHIFTDR | Shift Out Bypass Bit 99 | 1 |
| SHIFTDR | SHIFTDR | Shift Out Bypass Bit 100 | 1 |
| SHIFTDR | SHIFTDR | Shift Out DREG Bit 1 | 1 |
| SHIFTDR | SHIFTDR | Shift Out DREG Bit 2 | 1 |
| ↓ | ↓ | ↓ | ↓ |
| SHIFTDR | SHIFTDR | Shift Out DREG Bit 7 | 1 |
| SHIFTDR | SHIFTDR | Shift Out DREG Bit 8 | 1 |
| EXITDR | UPDATEDR | Halt Shift Out Operation | 1 |
| UPDATEDR | RT/IDLE | NOP | 1 |
| Read Next Word | | | 113 |

During memory write operations, the test bus controller inputs control on the TMS and TCK inputs of the ICs in FIG. 4 to load instructions into each IC's IREG. To reduce the scan path length to a minimum length, all the ICs except for the target IC are loaded with an instruction which selects their Bypass DREG. The target IC is loaded with an instruction that selects the DREG connected to the internal memory and configures the DREG and memory for a write operation.

When writing data into the memory of the target IC, the test bus controller only needs to output data from its TDO output, it does not necessarily need to input data from its TDI input. The bit length of the serial data output from the test bus controller is determined by the number of bits in the memory word plus a bit for each IC's (1 ... n) bypass register. Assuming the memory word width is eight bits and one hundred ICs exist between the test bus controller and the target IC, the number of bits that must be output to the target IC for each write operation is 108 bits.

During memory write operations, the TAP of each IC responds to the external TMS and TCK control signals from the test bus controller to output internal control on bus 26 (see FIG. 1) to cause their DREGs to preload the data. The target IC's DREG preloads "don't care" data since it is not reading memory data and the bypass registers of the other ICs (1 through n) each preload with a logic zero. After the DREGs of each IC are loaded, the test bus controller issues control on TMS and TCK to cause the TAPs in each IC to output internal control on bus 26 to shift in the 8-bit data word output from the test bus controller.

The destination of the 8-bit data word is the 8-bit DREG of the target IC. However, before the 8-bit data word enters to the target IC, it must first be shifted through the bypass bits of ICs 1 through n. To input the 8-bit data word into the DREG of the target IC, the test bus controller outputs control on TMS and TCK signals to cause 108 bits of data to be shifted. After 108 data bit shifts, the 8-bit data word has been shifted through the one hundred bypass register bits of ICs 1 through m and into the 8-bit DREG of the target IC. After the data word is loaded into the DREG of the target IC, the test bus controller outputs control on the TMS and TCK signals to halt the shifting process and load the data word into the memory. This described process of preloading data, shifting data into the target IC, followed by writing the data into the memory, must be repeated for each additional data word written into the memory.

Table 2 shows the states (as discussed in connection with FIG. 2) that the TAP 12 of each IC 30 in FIG. 4 must transition through to write one memory word. In Table 2, it is seen that it takes three TCKs at the start of each write operation before the shifting of data begins one of the three TCKs is used to load data into the DREGs, the bypass registers of ICs 1 through n is loaded with a logic zero and the DREG of the target IC is loaded with a "don't care" data pattern. The shifting of the data through the one hundred leading ICs and into the DREG of the target IC requires 108 additional TCKs. After the 8-bit data pattern is shifted into the DREG of the target IC, it takes two additional TCKs to halt the shift operation and write the data into the memory. The total number of TCKs required to write one 8-bit memory word into the target IC's memory is 113. If the memory has 1,000 words to be written, the state sequences in Table 2 must be repeated 1,000 times for a total of 113,000 TCK cycles.

TABLE 2

Writing Data Into Memory Using P1149.1 TAP Protocol

| Present TAP State | Next TAP State | Action Performed | TCK Periods Per Read |
|---|---|---|---|
| RT/IDLE | SELDRS | NOP | 1 |
| SELDRS | CAPTUREDR | NOP | 1 |
| CAPTUREDR | SHIFTDR | Load Data Into DREGs | 1 |
| SHIFTDR | SHIFTDR | Shift Into Bypass Bit 1 | 1 |
| SHIFTDR | SHIFTDR | Shift Into Bypass Bit 2 | 1 |
| ↓ | ↓ | ↓ | ↓ |
| SHIFTDR | SHIFTDR | Shift Into Bypass Bit 99 | 1 |
| SHIFTDR | SHIFTDR | Shift Into Bypass Bit 100 | 1 |
| SHIFTDR | SHIFTDR | Shift Into DREG Bit 1 | 1 |
| SHIFTDR | SHIFTDR | Shift Into DREG Bit 2 | 1 |
| ↓ | ↓ | ↓ | ↓ |
| SHIFTDR | SHIFTDR | Shift Into DREG Bit 7 | 1 |
| SHIFTDR | SHIFTDR | Shift Into DREG Bit 8 | 1 |
| EXITDR | UPDATEDR | Halt Shift In Operation | 1 |
| UPDATEDR | RT/IDLE | Write Data Into Memory | 1 |
| Read Next Word | | | 113 |

From these two examples, it is clear that an exceptionally large number of TCKs is required to load or unload data into a memory using the P1149.1 TAP protocols. Since the memory access time increases linearly with the number of TCKs required, it can take an exceptionally long time to load or unload a memory using the P1149.1 TAP protocols. Using the examples described above and a TCK frequency of 1 MHz, the access time for a memory with 1,000 locations is equal to:

(113,000 TCKs)×(1 microseconds/TCK)=113 milliseconds

The preferred embodiment of the present invention decreases the read/write access time to memories by providing a controller designed to be compatible with the P1149.1 architecture, or any other type of serial based scan architecture. This controller is referred to as a memory access controller (MAC) and provides the internal timing and control required to allow a memory to be continuously written to or read from using a single P1149.1 TAP write or read operation. The advantages of this approach is it eliminates the need of having to repetitively cycle through multiple TAP read or write operations as previously described.

Figure 5:
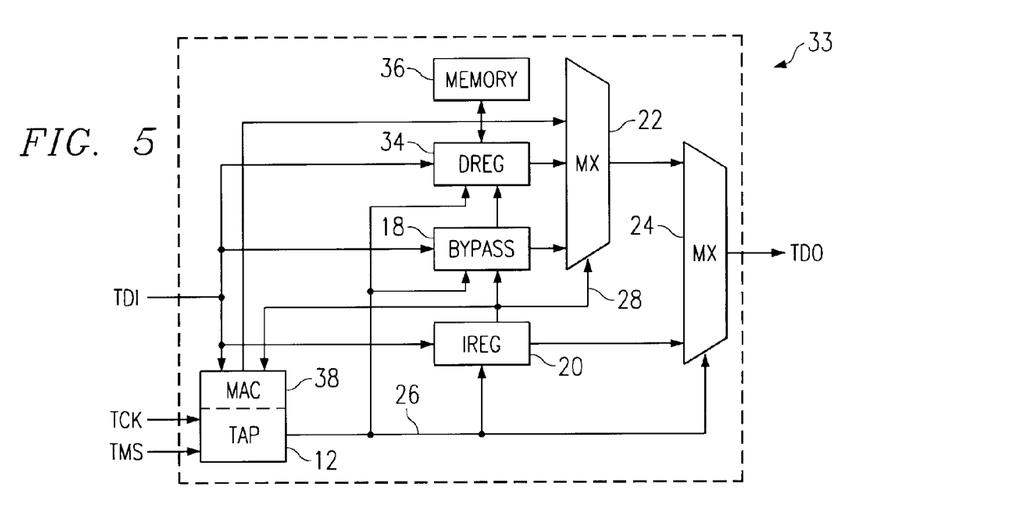
FIG. 5 illustrates a block diagram of the target integrated circuit of FIG. 4, including a memory access controller.

In FIG. 5, the MAC of the preferred embodiment is shown included in with the P1149.1 architecture, along with a DREG and memory combination as described earlier. FIG. 5 differs from FIG. 1 in that the MAC 38 receives input from test bus 28 and the TDI input, and outputs a TDO output to multiplexer 22. When no memory access operations are being performed, the MAC 38 is inactive and the architecture operates as described in connection with FIG. 1. However, when an instruction is loaded into the IREG enabling a memory read or write operation, the MAC is enabled, via control input from bus 28, to operate synchronously with the TAP 12 and the TMS and TCK control inputs.

During memory access operations, the MAC 38 takes over control of the signals output from the TAP 12 on bus 26 that operate the DREG and memory shown in FIG. 5. The MAC 38 monitors the TAP and TMS and TXK inputs during memory access and outputs control on bus 26 to perform the functions required during read and write operations. During memory read operations, the MAC determines when memory data is to be loaded into the DREG 34 to be shifted out to the test bus controller. During memory write operations, the MAC determines when the data shifted into the DREG 34 from the test bus controller 32 is to be loaded into the memory. The following examples illustrate the improvement the MAC provides for memory read and write operations over the previous method.

The internal architecture of the target IC in FIG. 4 includes the MAC as shown in FIG. 5. During memory read operations, the test bus controller inputs control on the TMS and TCK inputs of the ICs in FIG. 4 to load instructions into each IC's IREG. All the ICs except for the target IC 33 are loaded with an instruction which selects their bypass DREG. The target IC is loaded with an instruction that enables the MAC 38 and configures the DREG and memory for a read operation. The DREG 34 of the target IC is eight bits in length and one hundred ICs (T+1 through T+m) exist between the target IC and the test bus controller.

Since the MAC 38 controls when the DREG 34 loads and shifts out memory data, the task of reading the entire memory can be performed in one read operation. When the test bus controller 32 starts the read operation by issuing control on the TMS and TCK signals, the bypass registers of IC T+1 through T+m preload logic zeros and the MAC 38 loads the DREG of the target IC with the first 8-bit memory data word. When the test bus controller 32 outputs control to start the shift operation the bypass registers of ICs T+1 through T+m and the DREG of the target IC start shifting data towards the TDI input of the test bus controller.

At the end of eight data bit shifts the 8-bit data word initially loaded into the target IC's DREG is shifted out of the DREG and into the bypass bits of the first eight ICs (T+1 through T+8). When the last data bit (8th bit) is shifted out of the DREG, the MAC 38 outputs control on bus 26 to load the next 8-bit data word from the memory 36. This load operation occurs during the TCK that shifts out the last (8th) bit of the DREG 34 so that the first bit of the next word can be shifted out on the next TCK shift cycle. The bypass bits of ICs 1 through m act as temporary storage locations for the memory data enroute to the test bus controller's TDI input. The MAC 38 repeats this load/shift operation every eight TCKs until the last 8-bit data word has been loaded and shifted out of the target IC's memory. The test bus controller continues the read operation until it receives all the memory data bits temporarily stored in the bypass bits of ICs T+1 through T+m.

During the memory read operation, the first one hundred bits input to the TDI input of the test bus controller is a stream of logic zeros from the initial preloading of the bypass register bits in ICs T+1 through T+m. After the one hundred logic zeros have been shifted out of the bypass bits, the test bus controller 32 starts to receive the 8-bit serial data words from the memory of the target IC. Assuming the memory contained 1,000 8-bit data words, the test bus controller receives 1,000 packets of 8-bit serial data words after the initial one hundred bypass bits have been received. After the test bus controller 32 receives the serialized memory data it issues control on the TMS and TCK signals to cause the TAPs 12 in the ICs 30 of FIG. 4 to halt the shifting process and terminate the read operation.

Table 3 shows the states (FIG. 2) that the TAP of each IC in FIG. 4 must transition through during the read operation using the MAC. In Table 3, it is seen that it takes three TCKs at the start of the read operation before the shifting of data begins. One of the three TCKs is used to load data into the DREGs, the bypass registers of ICs T+1 through T+m is loaded with a logic zero and the DREG of the target IC is loaded with the first 8-bit memory word. Before the test bus controller 32 begins receiving data, all one hundred of the logic zeros loaded into the bypass registers bits must be shifted out of ICs T+1 through T+m, which takes one hundred TCKs. After the one hundred logic zeros are output, the test bus controller 32 starts receiving the 1,000 8-bit serial data words from the memory of the target IC, which requires 8,000 TCKs. After the test bus controller 32 has received the 8,000 data bits from the memory, it takes two additional TCKs to terminate the memory read operation. The total number of TCKs required to read the 1,000 8-bit memory words from the target IC of FIG. 4 is:

3+100+8,000+2=8,105 TCKs.

TABLE 3

READING DATA FROM MEMORY USING MAC

| Present TAP State | Next TAP State | Action Performed | TCK Periods Per Read |
|---|---|---|---|
| RT/IDS | SELDRS | NOP | 1 |
| SELDRS | CAPTUREDR | NOP | 1 |
| CAPTUREDR | SHIFTDR | Load Data Into DREGs | 1 |
| SHIFTDR | SHIFTDR | Shift Out Bypass Bit 1 | 1 |
| SHIFTDR | SHIFTDR | Shift Out Bypass Bit 2 | 1 |
| ↓ | ↓ | ↓ | ↓ |
| SHIFTDR | SHIFTDR | Shift Out Bypass Bit 99 | 1 |
| SHIFTDR | SHIFTDR | Shift Out Bypass Bit 100 | 1 |
| SHIFTDR | SHIFTDR | Shift Out 1st 8-bit Data Word | 8 |
| SHIFTDR | SHIFTDR | Shift Out 2nd 8-bit Data Word | 8 |
| ↓ | ↓ | ↓ | ↓ |
| SHIFTDR | SHIFTDR | Shift Out 999th 8-bit Data Word | 8 |
| SHIFTDR | SHIFTDR | Shift Out 1000th 8-bit Data Word | 8 |
| EXITDR | UPDATEDR | Halt Shift Out Operation | 1 |
| UPDATEDR | RT/IDLE | NOP | 1 |
| | | | 8105 |

During memory write operations, the test bus controller 32 inputs control on the TMS and TCK inputs of the ICs 30 in FIG. 4 to load instructions into each ICs IREG. All the ICs except for the target IC are loaded with an instruction which selects their bypass DREG. The target IC is loaded with an instruction that enables the MAC 38 and configures the DREG 34 and memory 36 for a write operation. The DREG 34 of the target IC 34 is eight bits in length and one hundred ICs (T+1 through T+m) exist between the test bus controller 32 and the target IC 33.

Since the MAC 38 controls when the DREG 34 shifts in data and writes it into memory 36, the task of writing the entire memory can be performed in one write operation. When the test bus controller 32 starts the write operation by issuing control on the TMS and TCK signals, the bypass registers of IC 1 through n preload logic zeros and the MAC 38 prepares the memory to accept the first data word. When the test bus controller outputs control to start the shift operation, the bypass registers of ICs 1 through n start outputting logic zeros and inputting data from the test bus controller 32. The MAC 38 in the target IC delays writing data into the memory until it receives a START signal. The START signal indicates that all the logic zeros have been shifted out of the bypass bits in ICs 1 through n and that the bypass bits have been filled with data from the test bus controller 32 that is to be loaded into the target ICs memory.

When the MAC 38 receives the START signal, it begins shifting data into the DREG. The bypass bits in ICs 1 through n act as temporary storage locations for the data enroute to the target IC 33. After the DREG has accepted eight bits of data, the MAC 38 outputs control to write the 8-bit data word into the memory. This process of accepting eight bits of data into the DREG followed by writing the 8-bit data word into the memory continues while the write operation is in progress. After the test bus controller 32 has output all the data to be written into the targets memory and has shifted the data through the bypass bits of ICs 1 through n and into the target IC memory, it terminates the write operation by outputting control on the TMS and TCK signals.

Table 4 shows the states (as discussed in connection with FIG. 2) that the TAP 12 of each IC 30 in FIG. 4 must transition through during the write operation. This table assumes one hundred ICs between the test bus controller 32 and the target 33 and a memory 36 with 1,000 data words. In Table 4, it is seen that it takes three TCKs at the start of the write operation before the shifting of data begins. One of the three TCKs is used to load the bypass registers of the one hundred ICs with logic zeros. Before the MAC 38 enables the DREG 34 to accept serial data, all one hundred of the logic zeros must be shifted out of the bypass register bits of the one hundred ICs, requiring one hundred TCKs. After the one hundred logic zeros are shifted out, the MAC starts accepting the 1,000 8-bit data words transmitted to the target IC from the test bus controller 32 via the bypass bits in ICs 1 through n. This operation requires 8,000 TCKs. After the test bus controller has input the 8,000 data bits into the target IC's memory, it takes two additional TCKs to terminate the memory write operation. The total number of TCKs required to write the 1,000 8-bit memory words into the target IC's memory is:

3+100+8,000+2=8,105 TCKs.

TABLE 4

WRITING DATA TO MEMORY USING MAC

| Present TAP State | Next TAP State | Action Performed | TCK Periods Per Read |
|---|---|---|---|
| RT/IDLE | SELDRS | NOP | 1 |
| SELDRS | CAPTUREDR | NOP | 1 |
| CAPTUREDR | SHIFTDR | Load Data Into DREGs | 1 |
| SHIFTDR | SHIFTDR | Shift In Bypass Bit 1 | 1 |
| SHIFTDR | SHIFTDR | Shift In Bypass Bit 2 | 1 |
| ↓ | ↓ | ↓ | ↓ |
| SHIFTDR | SHIFTDR | Shift In Bypass Bit 99 | 1 |
| SHIFTDR | SHIFTDR | Shift In Bypass Bit 100 | 1 |
| SHIFTDR | SHIFTDR | Shift In 1st 8-bit Data Word | 8 |
| SHIFTDR | SHIFTDR | Shift In 2nd 8-bit Data Word | 8 |
| ↓ | ↓ | ↓ | ↓ |
| SHIFTDR | SHIFTDR | Shift In 999th 8-bit Data Word | 8 |
| SHIFTDR | SHIFTDR | Shift In 1000th 8-bit Data Word | 8 |
| EXITDR | UPDATEDR | Halt Shift In Operation | 1 |
| UPDATEDR | RT/IDLE | NOP | 1 |
| | | | 8105 |

From these two examples, it is clear that the MAC significantly reduces the number of TCKs required to access memory when compared to the previous two examples using the P1149.1 TAP protocols to access memory. Using the two MAC examples described above and a TCK frequency of 1 MHz, the access time for a memory with 1,000 location is equal to:

(8,105 TCKs)×(1 microseconds/TCK)=8.105 milliseconds

Comparing the 8.1 millisecond access time using the MAC with the 113 milliseconds access time using the P1149.1 TAP protocol shows that the MAC can access an identically sized memory using only 7% of the time required by the P1149.1 TAP protocol.

In the description of the MAC writing data into the memory, reference was made to a START signal. The START signal informs the MAC 38 that it is time to start inputting data from the bypass bits and storing it into the memory 36. The following four methods can be used to produce a START signal to the MAC. Other methods besides the ones mentioned below may be devised to start the write operation.

After a write operation is started, the TAPs 12 of the ICs 30 will be in the SHIFTDR state. Since the test bus controller knows how many ICs (1 through n) lie between its output and the target IC's input, it can create a START signal after the data has been shifted into bypass bits of the leading ICs (1 through n) by transitioning the TAP from the SHIFTDR state into the PAUSEDR state via the EXIT1DR state, then re-entering the SHIFTDR state from the PAUSEDR state via the EXIT2DR state. The MAC in the target IC can be designed to start the write operation based on sensing the TAP enter the PAUSEDR state a first time. Once the write operation is started the MAC ignores any subsequent PAUSEDR state entries during the rest of the write operation.

Since the test-bus controller knows how many ICs (1 through n) lie between its output and the target IC's input, it can create a START signal by outputting a series of bits, referred to as a header, which precede the actual serial data bits that are to be written into the memory. The MAC 38 in the target IC 33 can be designed to monitor for the occurrence of a header by inspecting the serial data bits output from the bypass bits of ICs 1 through n. Since the bypass bits will initially be outputting logic zeros from the preload operation, the MAC monitors for a first logic one, which is output prior to the data and is the start bit of the header. Following the first logic one, an additional number of header bits may be input to the MAC, if desired, to reduce the probability of starting a write operation on a false header input. The MAC knows the header bit length and pattern sequence. After MAC receives all the header bits, it starts the write operation.

The MAC 38 may be designed to include a counter which can be loaded prior to a write operation. The counter is loaded with the number of ICs (1 through n) that lie between the target IC and the test bus controller. After the write operation is started, the MAC 38 starts decrementing the counter during each shift operation. When the counter reaches a minimum count, data to be shifted into the memory is present on the target IC's TDI input and the MAC 38 starts inputting the data and storing it into memory.

The MAC 38 may be designed to allow monitoring a pin on the IC to determine when the write operation is to be started. In this method, the test bus controller would output a signal via an additional test pin to indicate to the target IC 33 that data is available at the target's TDI pin to input and store into the internal memory. This signal would be output from the test bus controller to the target IC after the data has been shifted through the bypass bits of ICs 1 through n.

Figure 6:
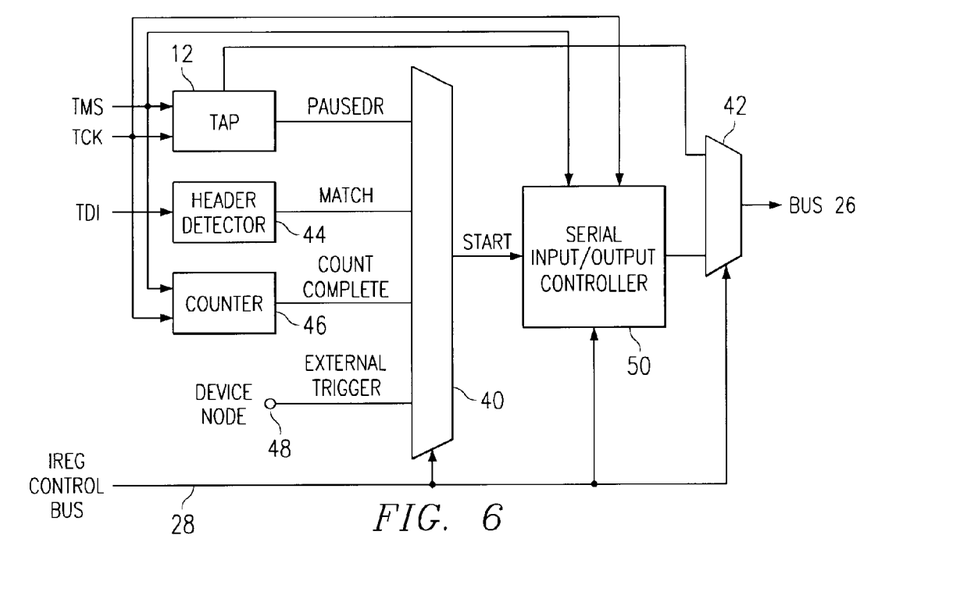
FIG. 6 illustrates a block diagram of a memory access controller.

FIG. 6 illustrates an exemplary implementation of a MAC/TAP. In this embodiment, the MAC 38 is operable to accept the four different types of start indicators previously described, namely: (1) using the TAP's PAUSEDR signal, (2) using a Header Detector, (3) using a counter COUNT COMPLETE signal, and (4) using an EXTERNAL TRIGGER. The TAP 12 is connected to a multiplexer 40 via a PAUSEDR signal. The output of the TAP 12 is also connected to the input of a multiplexer 42. A Header Detector 44 receives the TDI signal and outputs a MATCH signal to the multiplexer 40. A Counter 46 receives the TMS and TCK signals and outputs a COUNT COMPLETE signal to the multiplexer 40. An external device node 48 is connected to the multiplexer 40. The output of the multiplexer 40, the START signal, is connected to a serial input/output controller 50 along with the TMS and TCK signals. The IREG control bus 28 is connected to the select ports of the multiplexers 40 and 42 and to the serial input/output controller 50.

In operation, control from IREG bus 28 selects either the output of the TAP 12 or the output of serial input/output controller 50 to drive control bus 26 via multiplexer 42. When selected, the serial input/output controller 50 is enabled if one of the starting signals, PAUSEDR, MATCH, COUNT COMPLETE or EXTERNAL TRIGGER, are active, resulting in an active START signal.

It is important to remember that a start indicator is only required during a MAC write operation; a MAC read operation does not necessarily need a start indicator. However, a read operation could also use a start indicator, if desired. Not all of the start indicators shown in FIG. 6 need to be included in the design of the MAC. A MAC could operate with only one of the start indicators being input to the serial input/output controller, eliminating the need for the multiplexer 40. Also, other types of start indicators may be devised and input to the serial input/output controller, other than the ones described in this disclosure.

The TAP 12 is usually selected to output control from the multiplexer 42 on bus 26 to shift data through a selected DREG in the IC. The only time the MAC 38 is selected to output control on bus 26 is when an instruction has been loaded into the IREG 20 to select the MAC 38 for a serial input or output operation. During a MAC operated memory read operation, the serial input/out controller 50 will be enabled by input from the IREG 20 and control inputs TMS and TCK to output data from a device. During memory read operations, no start indication is required and the serial input/output controller 50 responds directly to the TMS and TCK inputs to output data.

During a MAC operated memory write operation, the serial input/output controller 50 will be enabled by input from the IREG and control inputs TMS and TCK to input data to a device. While control inputs from the IREG and TMS and TCK inputs arm the serial input/output controller 50 for a write operation, no write action occurs until the serial input/output controller 50 has received the START signal from multiplexer 40.

In FIG. 6, it is seen that a write operation can be started by one of four different signals: a PAUSEDR state output from the TAP 12, a match output from the Header Detector 44, a COUNT COMPLETE signal from the counter 46, and an external node signal. The instruction in the IREG 20 selects which start indicator is input to the serial input/output controller 50 to start a write operation.

One method of starting a write operation utilizes the TAP's internal PAUSEDR state. If this method is selected, the PAUSEDR state (see FIG. 2) is output from the TAP 12 and coupled to the serial input/output controller 50 via multiplexer 40. When this method is used, the test bus controller 32 (see FIG. 4) issues control on TMS and TCK to initiate a data register scan operation. The control causes data from the test bus controller 32 to shift through devices 1 through n towards the target device 33 (see FIG. 4). When the data arrives at the TDI input of the target device 33, the test bus controller 32 issues control that causes the TAPs of all the devices (1+n and the target) to enter the PAUSEDR state (see FIG. 2).

The serial input/output controller 50 senses the first PAUSEDR state output from the TAP 12 as the start indicator and prepares to output control on bus 26 whenever the test bus controller 32 issues control on TMS and TCK to resume data shifting by re-entering the SHIFTDR state (see FIG. 2). After the shifting of data is resumed, the test bus controller 32 will shift in all the data to be loaded into the target device 33. If the test bus controller 32 re-enters the PAUSEDR state again during the data register scan operation, the serial input/output controller 50 will ignore any additional PAUSEDR inputs from the TAP 12. When the test bus controller 32 has output the last data bit to be loaded into the target device 33, it will continue to shift the scan path to insure that the data is passed through devices 1 through n and into the target device before it issues control on TMS and TCK to terminate the shift operation.

One advantage of this method is that the logic to start the write operation already exists in the TAP and additional logic is not required. The other methods described below require either additional logic or an additional device input.

Figure 7:
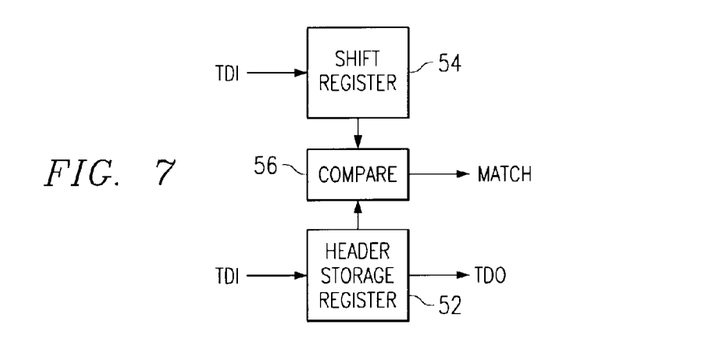
FIG. 7 illustrates a block diagram of a header detector circuit which may be used in the memory access controller of FIG. 6.

Another method of starting a write operation utilizes header detector logic 44. A block diagram of the header detector logic 44 is shown in FIG. 7. The header detector logic 44 comprises a DREG 52 for storing a header value, a shift register 54 for receiving a header bit sequence during a write operation, and a comparator logic 56 for matching the header bit sequence received with the header pattern stored in the DREG 52. During shift operations, DREG 52 is coupled to the TDI and TDO pins of target device 33.

This technique assumes the test bus controller 32 outputs a leading header bit sequence (such as "101101") prior to outputting the data that is to be written into the target device 33. During the write operation, the header detector logic 44 inputs the serial data into the shift register 54 and compares it against the preloaded header value in the header storage register. Initially, the shift register 54 will reset to all zeros so that a match between the shift register and header storage register is disabled. As the write operation starts, the shift register 54 begins receiving the logic zeros from the bypass registers in devices 1 through n. After the bypass register logic zeros have been received, the shift register 54 will begin receiving the header bit sequence output from the test bus controller 32. When the entire header is loaded into the shift register 54, a match will occur between the shift register contents and the header storage register 52. This MATCH signal is output from the compare logic and input to the serial input/output controller via multiplexer 40.

When the serial input/output controller 50 senses the MATCH signal from the header detector 44, it outputs control on bus 26 to start accepting the serial data being input to the target device 33 via the TDI input. When the test bus controller 32 has output the last data bit to be loaded into the target device 33, it will continue to shift the scan path to insure that the data is passed through devices 1 through n and into the target device 33 before it issues control on TMS and TCK to terminate the shift operation.

Figure 8:
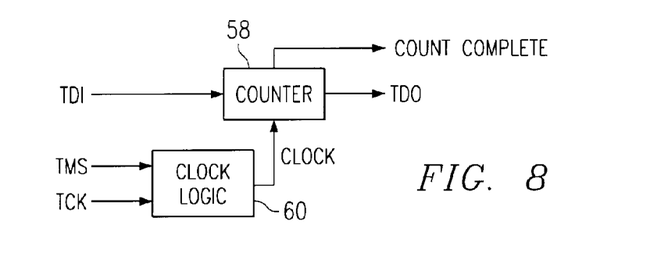
FIG. 8 illustrate a block diagram of a counter circuit which may be used in the memory access controller of FIG. 6.

Another method of starting a write operation utilizes counter logic. A block diagram of the counter logic 46 is shown in FIG. 8. The counter logic 46 comprises a DREG implementing a down counter 58 and clock logic 60 for producing a counter decrement clock for each bit shifted on the scan path. The down counter 58 can be shifted by a data register scan operation to load a desired count value into the counter 58. During shift operations, the down counter is connected to the TDI and TDO pins of target device 33. The counter contains decode logic to sense a minimum count value which is output from the counter via the COUNT COMPLETE signal.

This technique requires that the test bus controller 32 loads the counter 58 with a count value prior to performing a write operation. The count value loaded is equal to the number of bypass register bits (1 through n) the data must pass through before being input to the target device. When the test bus controller 32 starts a write operation, the counter decrements once for each time a data bit is shifted through the scan path between the controller and target device. When the counter reaches a minimum value and outputs the COUNT COMPLETE signal, the data from the controller has been shifted through all the bypass registers of the devices 1 through n and is applied to the TDI input pin of the target device.

When the serial input/output controller 50 senses the COUNT COMPLETE signal from the counter 58, it outputs control on bus 26 to start accepting the serial data being input to the target device 33 via the TDI input. When the test bus controller 32 has output the last data bit to be loaded into the target device 37, it will continue to shift the scan path to insure that the data is passed through devices 1 through n and into the target device 33 before it issues control on TMS and TCK to terminate the shift operation.

Another method of starting a write operation utilizes an additional device input node 48, as shown in FIG. 6. The input source to this pin may come from the test bus controller 32 or from another device which can output a signal to indicate when the MAC should start accepting data at the target device's TDI input pin during a write operation.

When the serial input/output controller 50 senses the external trigger input signal from the device node 48, it outputs control on bus 26 to start accepting the serial data being input to the target device 33 via the TDI input. When the test bus controller has output the last data bit to be loaded into the target device 32, it will continue to shift the scan path to insure that the data is passed through devices 1 through n and into the target device before it issues control on TMS and TCK to terminate the shift operation.

While the preferred embodiment has been illustrated using a test bus connecting a plurality of integrated circuits, the bus could similarly be used to connect subcircuits within a single integrated circuit, or to connect circuits each comprising a plurality of integrated circuits. Also, while the preferred embodiment has been illustrated in connection with the transfer of test data, it could be used for any type of data communication between devices.

Although the present invention has been described in detail, it should be understood that various changes, substitutions and alterations can be made herein without departing from the spirit and scope of the invention as defined by the appended claims.

What is claimed is:

1. An integrated circuit comprising:

A. a substrate of semiconductor material:
   B. a test mode select (TMS) lead;
   C. a test clock (TCK) lead;
   D. a first control bus leads;
   E. a second control bus leads;
   F. a serial input/output controller having a start input, a TMS input connected to the TMS lead, a TCK input connected to the TCK lead, a control bus input connected to the second control bus lead, and a control bus output; and
   C. an output multiplexer having two data inputs, a control input and a data output, one of the two data inputs being connected to the control bus output of the serial input/output controller, the data output being connected to the first control bus leads, and the control input being connected to the second control bus leads.

2. The integrated circuit of claim 1 including an input multiplexer having an output connected to the start input of the serial input/output controller and having a control input connected to the second control bus leads.

3. The integrated circuit of claim 1 including an input multiplexer having an output connected to the start input of the serial input/output controller and having a control input connected to the second control bus leads, the input multiplexer having a PauseDR signal input, a match signal input and a count complete signal input.

4. The integrated circuit of claim 1 including an input multiplexer having an output connected to the start input of the serial input/output controller and having a control input connected to the second control bus leads, the input multiplexer having a PauseDR signal input, a match signal input, a count complete signal input, and an external trigger signal input.

5. The integrated circuit of claim 1 in which the test mode select lead carries a test mode select signal.

6. The integrated circuit of claim 1 in which the test clock lead carries a test clock signal.

7. The integrated circuit of claim 1 in which the second control bus leads carry instruction register control signals.

* * * * *